(12) United States Patent
Liu et al.

(10) Patent No.: US 7,776,699 B2
(45) Date of Patent: Aug. 17, 2010

(54) STRAINED CHANNEL TRANSISTOR STRUCTURE AND METHOD

(75) Inventors: Jin Ping Liu, Singapore (SG); Alex K H See, Singapore (SG); Mei Sheng Zhou, Singapore (SG); Liang Choo Hsia, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 54 days.

(21) Appl. No.: 12/025,788

(22) Filed: Feb. 5, 2008

(65) Prior Publication Data

US 2009/0194788 A1    Aug. 6, 2009

(51) Int. Cl.
*H01L 29/778* (2006.01)
(52) U.S. Cl. ............................... 438/285; 438/343
(58) Field of Classification Search ............. 257/190, 257/496, 586; 438/285, 343
See application file for complete search history.

(56) References Cited

U.S. PATENT DOCUMENTS

| | | | | |
|---|---|---|---|---|
| 5,330,929 A | * | 7/1994 | Pfiester et al. | 438/152 |
| 5,354,707 A | * | 10/1994 | Chapple-Sokol et al. | 438/24 |
| 5,989,947 A | * | 11/1999 | Dilger et al. | 438/172 |
| 7,682,943 B2 | * | 3/2010 | Samuelson et al. | 438/478 |
| 2001/0045582 A1 | * | 11/2001 | Schmidt et al. | 257/269 |
| 2003/0042565 A1 | * | 3/2003 | Schmidt et al. | 257/438 |
| 2004/0016957 A1 | * | 1/2004 | Wu | 257/316 |
| 2006/0202280 A1 | * | 9/2006 | Shima et al. | 257/371 |
| 2008/0251842 A1 | * | 10/2008 | Sudo | 257/347 |
| 2009/0184346 A1 | * | 7/2009 | Jain | 257/288 |

* cited by examiner

*Primary Examiner*—Wai-Sing Louie
*Assistant Examiner*—Sue Tang
(74) *Attorney, Agent, or Firm*—Horizon IP Pte Ltd

(57) ABSTRACT

A transistor device structure comprising: a substrate portion formed from a first material; and a source region, a drain region and a channel region formed in said substrate, the source and drain regions comprising a plurality of islands of a second material different from the first material, the islands being arranged to induce a strain in said channel region of the substrate.

28 Claims, 6 Drawing Sheets

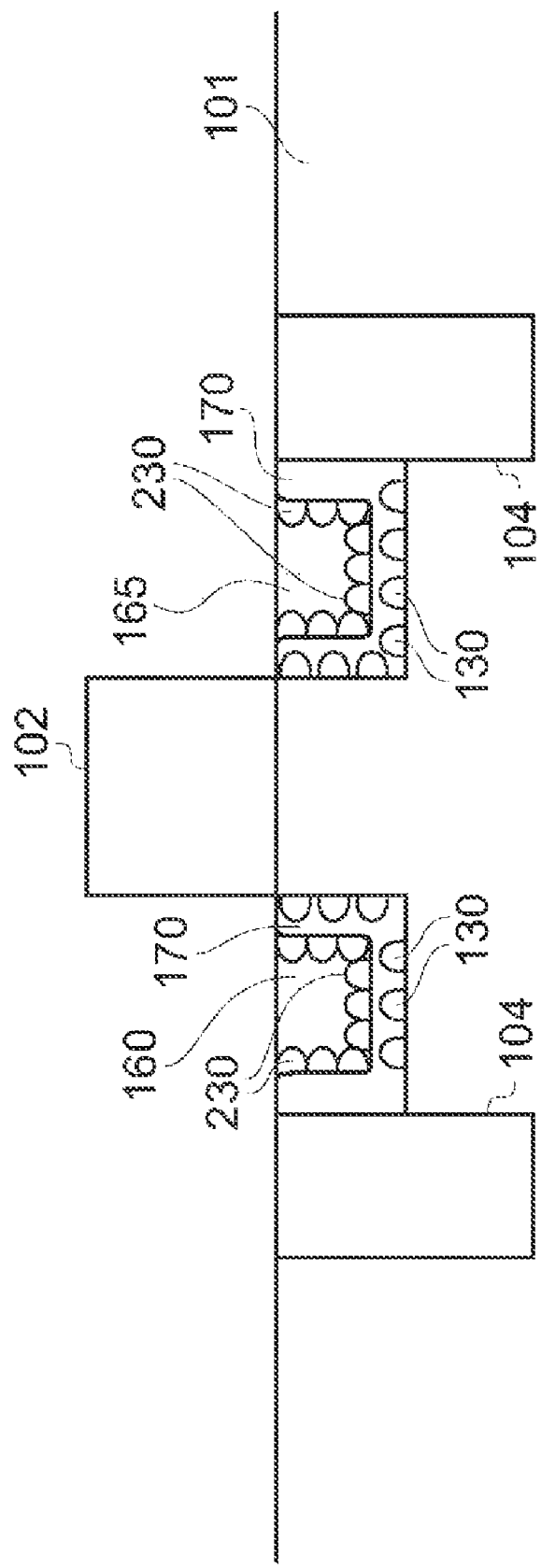

STRAINED CHANNEL TRANSISTOR STRUCTURE AND METHOD

FIELD OF THE INVENTION

The present invention relates to strained channel transistor devices formed on an integrated circuit (IC) wafer and to a method of fabricating said devices. More particularly, but not exclusively, the invention relates to a strained channel transistor device and method having source and drain regions each comprising islands of a strain-inducing material.

DESCRIPTION OF THE RELATED ART

Strain engineering has played an important role in scaling the size of silicon CMOS device structures. Calculations suggest that inducement of an appropriate strain in the channel region of a CMOS transistor device can lead to an increase in carrier mobility of up to four times that in the absence of the strain.

Strain can be induced in the channel region of a MOS transistor device by forming source and drain stressor elements in source and drain regions of a device. Depending upon the material used to form the stressor elements, they may be configured to impart either a tensile or a compressive strain.

For example, it is known to form stressor elements in trenches formed in the source and drain regions of a transistor device. The stressor elements are formed by epitaxial growth of a material having a lattice parameter that is either smaller or larger than that of the substrate upon which the device is fabricated, depending on whether it is required to induce a tensile or compressive stress, respectively, in the channel region.

In the case of an NMOS transistor device it is desirable to induce a tensile stress in the channel region. Therefore a material having a lattice parameter smaller than that of the substrate is formed in the stressor region. In the case of a silicon substrate, the stressor material may be a silicon carbon alloy.

In the case of a PMOS transistor device it is desirable to induce a compressive stress in the channel region. Consequently a material having a lattice parameter larger than that of the substrate is formed in the stressor region. In the case of a silicon substrate, the stressor material may be a silicon germanium alloy.

It has been calculated that if the stress in the channel region of a PMOS device can be made higher than 1.5 GPa, an increase in carrier mobility of around a factor of 4 should result. This corresponds approximately to a doubling of on-current (Ion) gain.

However, a number of factors limit the extent to which SiGe stressor elements can enhance device performance.

Firstly, the Ni-based silicidation window is different for SiGe alloy compared with Si. The external resistance of NiSi contacts are higher when formed over SiGe alloy compared with Si, and this results in a reduction in the net improvement in device performance obtainable using SiGe stressor elements. Formation of a metal silicide on SiGe compared with Si typically requires a higher temperature, which can result in agglomeration of Ge.

Secondly, the upper limit to the amount of stress that can be induced by forming SiGe alloy stressor elements has been found to be lower than that predicted by theory. Increasing the relative proportion of Ge above 25 atomic percent should in principle increase the amount by which the channel is strained. However, it is found that strain relaxation occurs at Ge concentrations in excess of around 25 atomic percent.

Thirdly, it has been found that existing device architectures are not scalable to smaller sizes. This is because elastic relaxation becomes more significant as device pitch decreases, reducing the amount of strain that can be induced in the channel.

Subsequent processing of the device structure can also be complicated by the presence of SiGe alloy. For example, as traditional device structures are scaled to smaller dimensions they are found to be less susceptible to damage during the course of implantation operations. However, the presence of increasing amounts of Ge in the structures results in a correspondingly increased amount of damage to be introduced by the same implantation operations.

SUMMARY OF THE INVENTION

Embodiments of the invention seek to mitigate at least some of the above mentioned problems.

Some embodiments of the invention provide a PMOS transistor device structure having an increased level of compressive strain in the channel region of the device structure.

Some embodiments of the invention provide an NMOS transistor device structure having an increased level of tensile strain in the channel region of the device structure.

According to a first aspect of the invention there is provided a transistor device structure comprising: a substrate portion formed from a first material; and a source region, a drain region and a channel region formed in said substrate, the source and drain regions comprising a plurality of islands of a second material different from the first material, said islands being arranged to induce a strain in said channel region of the substrate.

According to a second aspect of the invention there is provided a method of forming a transistor device structure on a substrate comprising the steps of: providing a substrate formed from a first material; and forming a source region, a drain region and a channel region in said substrate, said source and drain regions each comprising a plurality of islands of a second material different from said first material, said islands being arranged to induce a strain in said channel region of the substrate.

According to a third aspect of the invention there is provided a method of forming a transistor device structure on a substrate comprising the steps of: providing a substrate formed from a first material; forming a source recess and a drain recess in said substrate; forming a first layer of strained epitaxial islands of a second material in said source and drain recesses, said second material having a lattice parameter different from a corresponding lattice parameter of said first material, said islands being arranged to induce a strain in said channel region; and filling said source and drain recesses with first material.

BRIEF DESCRIPTION OF THE DRAWINGS

Embodiments of the present invention will now be described hereinafter, by way of example only with reference to the accompanying drawings, in which:

FIGS. 1 to 6 show structures formed in processes according to some embodiments of the invention.

DETAILED DESCRIPTION OF THE INVENTION

Figure 1:
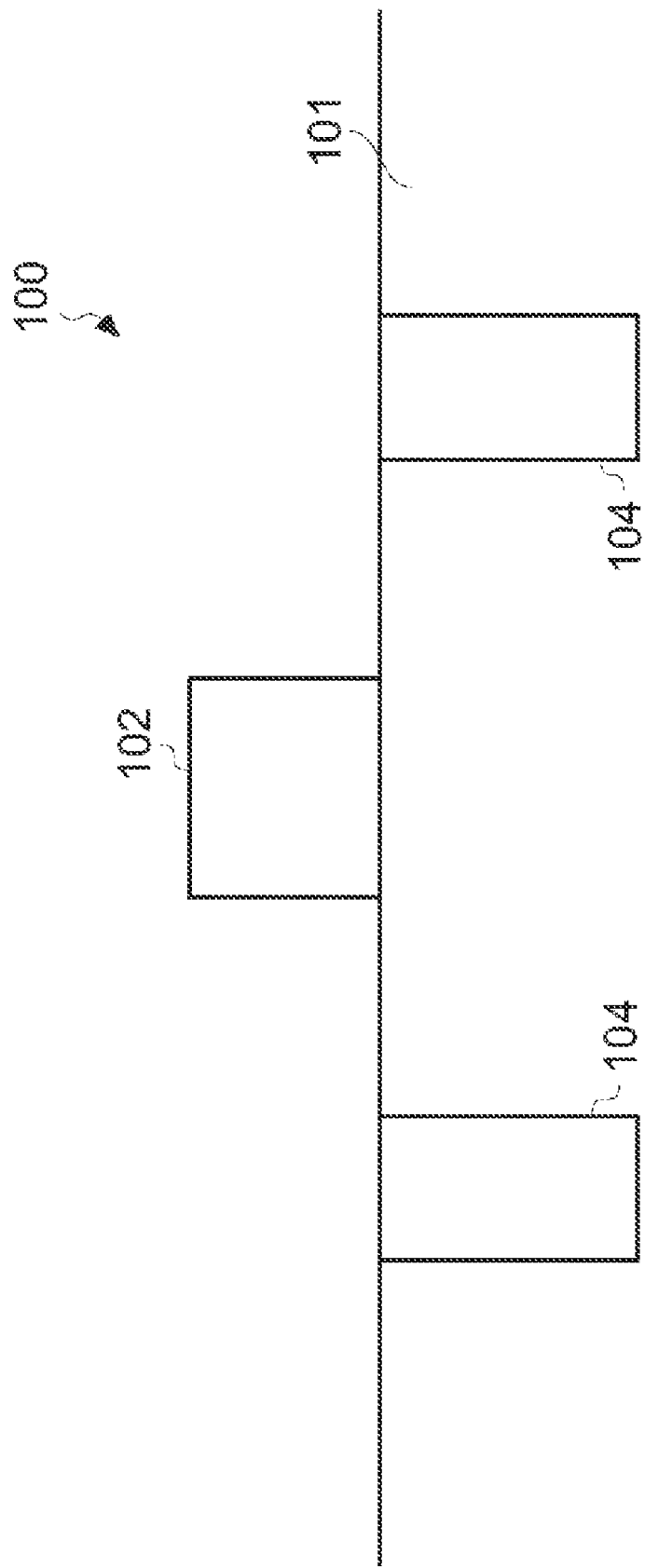

FIG. 1 shows a process for forming a structure 101 of an IC according to an embodiment of the invention. The structure, for example, comprises a transistor of the IC. The transistor can be a metal oxide semiconductor (MOS) transistor. The transistor can be a p-type or n-type transistor. A substrate 101 is provided. The substrate, for example, comprises silicon. Other types of semiconductor substrates are also useful. An active region is defined by isolation regions 104. In one embodiment, the isolation regions comprise shallow trench isolations (STIs). The isolation regions are formed from silicon oxide. Other insulating materials are also useful. The isolation regions separate the active regions from active regions of other device structures.

A gate stack 102 is formed on the surface of the substrate in the active region. In one embodiment, the gate stack is formed at about the center of the active region. The gate stack comprises a gate electrode over a gate oxide. Typically, the gate electrode comprises polysilicon and the gate oxide comprises thermal oxide. Other types of materials for forming the gate electrode and gate oxide are also useful. A dielectric cap is provided over the gate electrode. Dielectric spacers can be provided on the sidewalls of the gate stack. Typically, a dielectric surface layer lines the surface of the substrate. Various dielectric materials can be used for the cap, spacers and surface liner, such as silicon nitride, silicon oxide or a combination thereof The type of dielectric material used can depend on, for example, the integration scheme employed.

Figure 2:
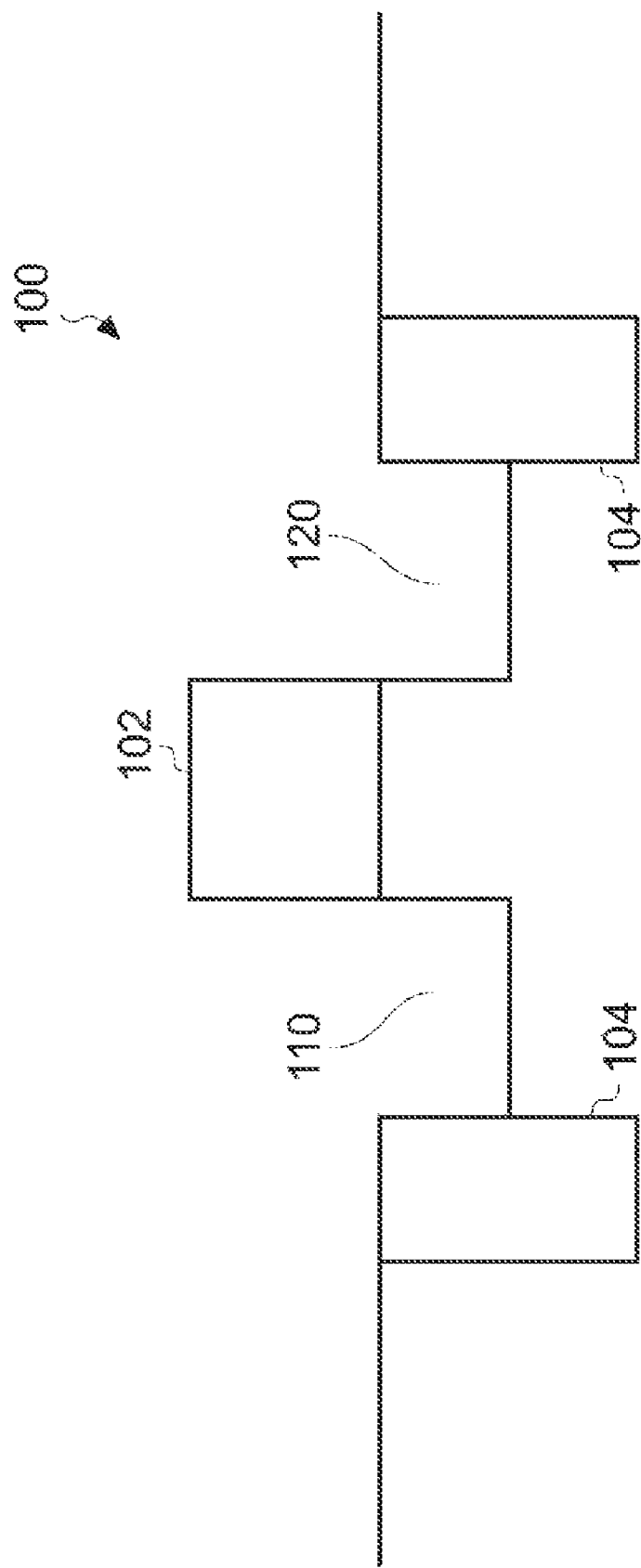

Referring to FIG. 2, recesses 110 and 120 are formed in source/drain regions of the transistor adjacent to the gate. Conventional techniques can be employed to form the recesses. For example, a reactive ion etching (RIE) process using a patterned mask etches the substrate to form the recesses. The patterned mask can be a soft mask such as photoresist. Other techniques for forming the recesses are also useful. After forming the recesses, the mask can be removed. Leaving the mask over the substrate is also useful.

In the embodiment, the recesses are formed to span substantially the entire distance from the gate stack 102 to the STIs. Consequently a wall of each recess is provided by a portion of an STI. In some embodiments, the recesses do not span this entire distance. In some embodiments, one or both recesses 110, 120 do not extend as far as the corresponding STIs.

Figure 3:
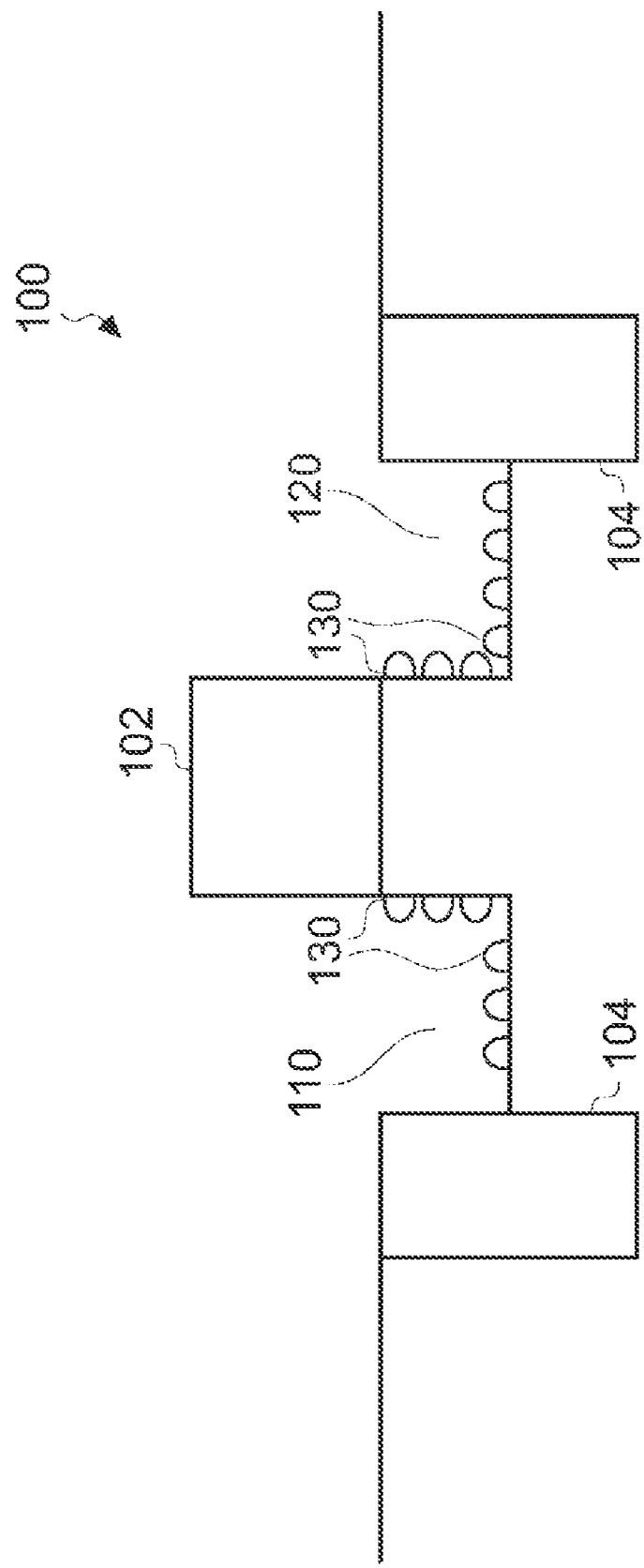

Referring to FIG. 3, a discontinuous semiconductor layer 130 is in the trench. The discontinuous semiconductor layer comprises quantum dots (QD) or island like structures. The discontinuous layer comprises, for example, a crystalline material. Various types of crystalline materials, such as silicon germanium (SiGe), indium arsenide (InAs), indium phosphide (InP), or silicon carbide (SiC) or a combination thereof, are also useful. The discontinuous semiconductor layer comprises a lattice parameter which is different from the lattice parameter of the substrate to induce stress. The material used depends on, for example, the type of stress to induce on the substrate. For example, in the case of a n-type transistor, the lattice parameter of the discontinuous semiconductor layer is smaller than that of the substrate to induce a tensile stress. Tensile stress inducing material includes, for example, SiC. In the case of a p-type transistor, the lattice parameter of the discontinuous semiconductor layer is larger than that of the substrate to induce a compressive stress. Compressive stress materials can include materials such as SiGe.

In one embodiment, the discontinuous semiconductor layer lines the trench walls. Preferably, the semiconductor layer is selectively formed on crystalline surfaces, such as silicon. For example, this forms the discontinuous semiconductor layer of the bottom and sidewall of the trenches nearer to the gate stack. The other trench sidewall, top of the gate stack and other portions of the surface of the substrate is protected by dielectric material. The discontinuous semiconductor layer can be formed by epitaxial growth, such as molecular beam epitaxy. Other deposition techniques are also useful. Preferably, the discontinuous semiconductor layer is formed by Stranski-Krastanov (SK) mode. Typically, in the SK mode, a wetting layer forms on the trench surface during deposition on which the island like structures are formed. Other deposition techniques, such as Volmer-Weber (VW) mode, are also useful.

It will be appreciated that certain parameters associated with the formation of semiconductor islands, such as the size of the islands, the number density of islands (and therefore the extent to which the surface over which the islands are formed is covered) will depend upon the epitaxial growth conditions selected. The growth conditions include the deposition rate of material, the temperature of the surface upon which the islands are formed, vacuum conditions, and so forth.

Figure 4:
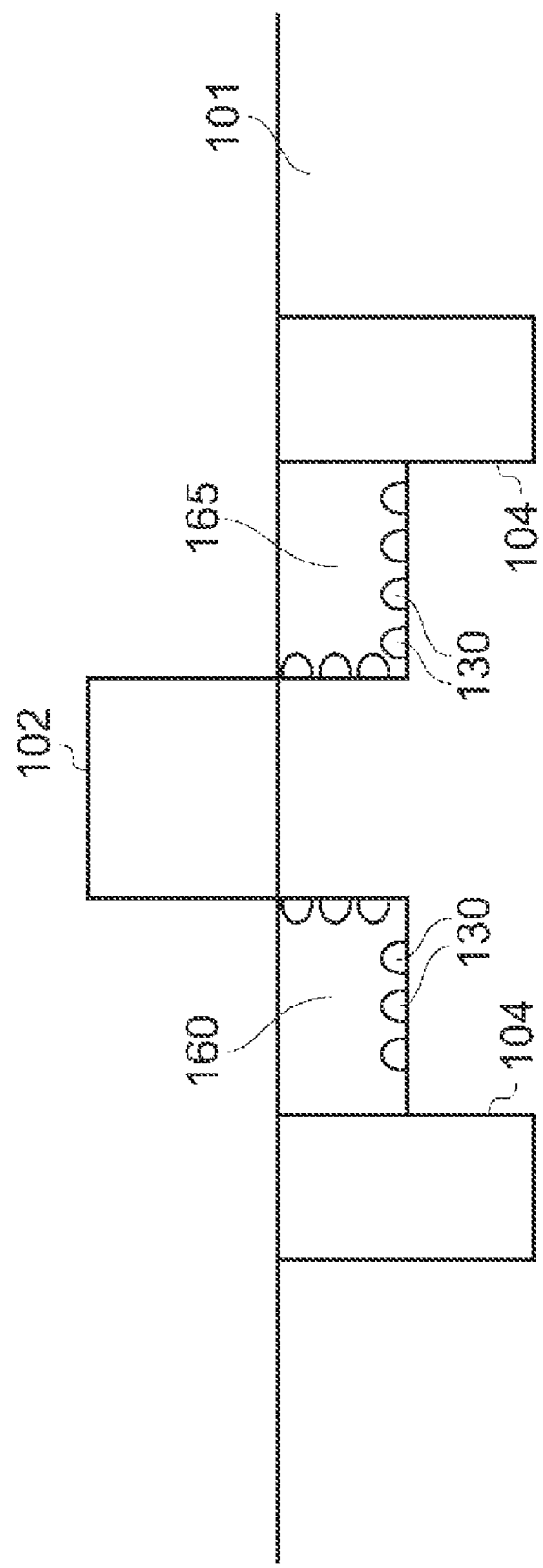

As shown in FIG. 4, the recesses are filled with semiconductor crystalline fill material. In one embodiment, the recesses are filled with silicon, forming source/drain stressor regions 160 and 165. Other types of crystalline materials for filling the trenches are also useful. In the embodiment, the semiconductor crystalline fill material is formed by epitaxial growth, such as molecular beam epitaxy. Preferably, the semiconductor crystalline fill material is formed by selective epitaxial growth. Other deposition techniques are also useful.

Subsequently, the source/drain regions are implanted with dopant atoms. For a n-type transistor, n-type dopant atoms are implanted while p-type dopant atoms are implanted for p-type transistor. In some embodiments of the invention, the source/drain regions are doped by an in-situ doping process in which doping is performed during filling of the source and drain region. Other methods of forming the source/drain regions are also useful.

Figure 5:
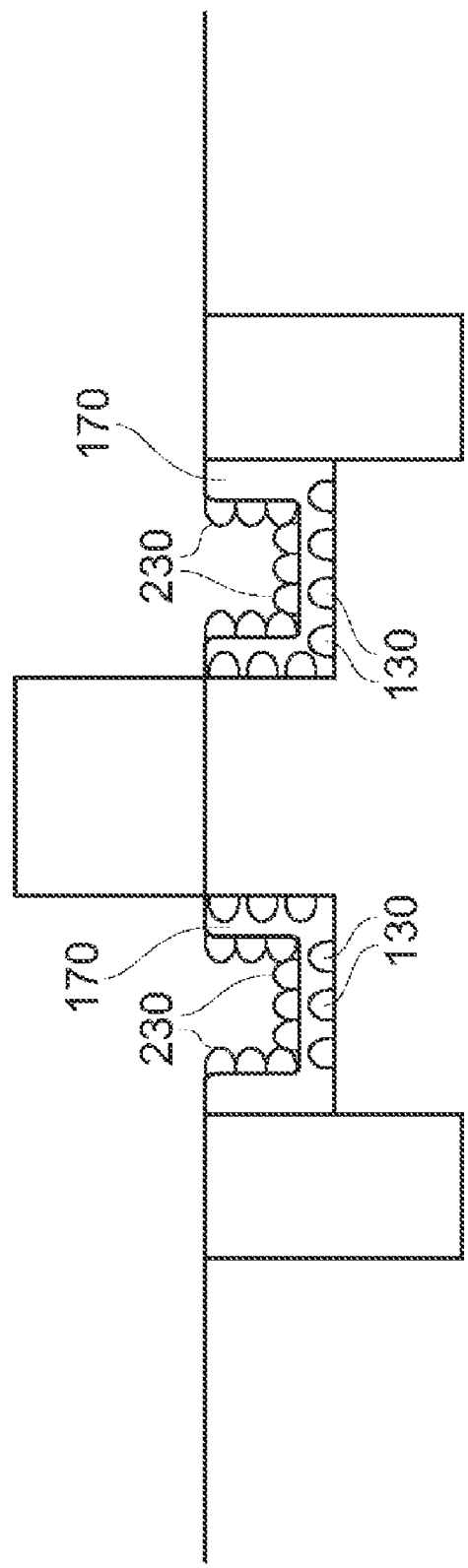

FIG. 5 shows an alternative embodiment of the invention. As shown, the source/drain recesses are filled with a plurality of discontinuous semiconductor layers. In one embodiment, the recesses are filled with first and second discontinuous semiconductor layers 130 and 230, as described in FIG. 3. Providing other number of discontinuous semiconductor layers are also useful. After forming the first discontinuous semiconductor layer, a semiconductor crystalline capping layer is formed to fill the space between the island like structures. The semiconductor crystalline capping layer, for example, comprises silicon formed by epitaxial growth, for example, molecular beam epitaxy. Preferably, the semiconductor crystalline filler layer is formed by selective epitaxial growth. Other crystalline materials or deposition techniques are also useful.

In some embodiments of the invention, the process of forming a capping layer 170 and subsequently forming a layer of SiGe islands is repeated to form a multiple layer (or multilayer) structure. In the embodiment of FIG. 5, the islands of each layer are of the same composition as the islands of other layers.

After the last discontinuous semiconductor layer is formed, the recesses are filled with a semiconductor crystalline fill material, such as silicon, to form source/drain stressor regions, as shown in FIG. 6. Other types of semiconductor fill materials are also useful. Various techniques such as epitaxial growth or selective epitaxial growth can be used to form the crystalline fill material. The source/drain stressor regions can be implanted with dopant atoms to form source/drain regions. Alternatively, the stressor regions can be doped by an in-situ doping process. Other methods of forming the source/drain regions are also useful.

Other configurations of island growth are also possible. In some embodiments, islands are only formed in the portion of the recesses immediately adjacent to the channel region, such as the generally vertical walls of the recesses immediately adjacent to the channel region.

In some embodiments, other materials are used to form the islands 130. In some embodiments the islands are formed from InAs alloy. In some embodiments, the islands are formed from InP alloy. Other materials are also useful, In embodiments in which islands are formed from an alloy such as SiGe, different compositions of the alloy are useful. In some embodiments, employing a SiGe alloy in which the Ge content of the alloy is in the range from around 1 to around 50 atomic percent. In some embodiments the Ge content is in the range from around 15 to around 25 atomic percent. In some embodiments, the Ge concentration is in the range from around 17 to around 24 atomic percent.

In some embodiments, the Ge content of the alloy is in the range from around 50 to around 100 atomic percent. In some embodiments, the Ge content of the alloy is in the range from around 80 to around 100 atomic percent. Other Ge concentrations are also useful.

In some embodiments, islands in respective different layers are formed from alloys having different compositions. In some embodiments, of the invention the alloy is an alloy of Si and Sn instead of an alloy of Si and Ge. Other alloys are also useful.

In some embodiments, islands are formed in source and drain regions by ion implantation. Thus, in some embodiments of the invention, etching to form source and drain stressor recesses is not required.

In the case where ion implantation is used to form particles of an alloy, where one component is present in the substrate material already, one or both alloy components may be implanted into the substrate.

Thus, for example in the case of the formation of SiGe islands in a Si substrate, Ge atoms may be implanted without a requirement to implant Si atoms. In some embodiments, both Si and Ge atoms are implanted to form SiGe alloy islands. In some embodiments, annealing of the structure to form strained SiGe alloy islands is required.

In the case of the formation of SiSn alloy islands in a Si substrate, Sn atoms may be implanted. Annealing of the structure is required in some embodiments in order to form strained SiSn alloy islands. It will be appreciated that the concentration of Ge atoms or Sn atoms in these islands may be different in different embodiments of the invention depending upon the amount of strain it is required to induce in the channel region.

It will be appreciated that in some embodiments the implanted islands are not alloy islands, but rather islands comprising a single chemical element (such as Ge or any other suitable element), or a chemical compound rather than a single chemical element or an alloy of two or more chemical elements. Any suitable chemical element, alloy of chemical elements or compound of chemical elements may be used that has the effect that a strain is induced in the channel of the MOSFET device.

It will be appreciated that islands having different compositions are likely to induce different respective strains in the channel. Some islands will induce compressive strains. Some islands will induce tensile strains.

In some embodiments of the invention, strained SiGe alloy islands are formed in the source and drain regions of a PMOS transistor device, to induce a compressive strain in the channel region of the device. A compressive strain is induced at least in part because SiGe alloy has a larger lattice parameter than Si.

In some embodiments of the invention, strained islands are formed in the source and drain regions of NMOS transistor devices. In this case, the strained islands are arranged to have a lattice parameter less than that of the substrate material, thereby inducing a tensile strain in the channel region of the device. In some embodiments, the islands are formed from a silicon carbon alloy. The carbon content may be in the range of from around 1 to around 25 atomic percent carbon. Other carbon concentrations are also useful. Other materials are also useful for inducing a tensile strain in the channel region.

Throughout the description and claims of this specification, the words "comprise" and "contain" and variations of the words, for example "comprising" and "comprises", means "including but not limited to", and is not intended to (and does not) exclude other moieties, additives, components, integers or steps.

Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith.

What is claimed is:

1. A method of forming a transistor device structure on a substrate comprising:
    providing a substrate formed from a first material having a transistor region, the transistor region is prepared with a gate and a channel region under the gate;
    forming recesses in the substrate in source/drain regions adjacent to the gate, wherein a channel region is disposed under the gate; and
    forming a discontinuous layer of a second material which is different from the first material in the recesses, the discontinuous layer comprising quantum dots, the discontinuous layer configured induces a strain in the channel region of the transistor.

2. A method as claimed in claim 1 wherein the discontinuous layer is formed by epitaxial growth.

3. A method as claimed in claim 1 wherein forming the source/drain regions comprises:
    forming source/drain recesses in the source/drain regions; and
    forming a first layer of the discontinuous layer in the recesses.

4. A method as claimed in claim 3 comprising coating the discontinuous layer with a capping layer.

5. A method as claimed in claim 4 wherein the capping layer comprises a layer comprising the first material.

6. A method as claimed in claim 4 comprising selectively forming a second discontinuous layer on the capping layer and the first material.

7. A method as claimed in claim 6 comprising forming a multilayer structure of discontinuous layers with a capping layer provided between adjacent discontinuous layers.

8. A method as claimed in claim 6 wherein the first material comprises silicon and the second material is selected from amongst SiGe alloy, InAs alloy, InP alloy and SiC alloy.

9. A method as claimed in claim 6 wherein forming the discontinuous layer includes ion implantation.

10. A method as claimed in claim 9 wherein the discontinuous layer comprises SiGe.

11. A method as claimed in claim 3 comprises filling the recesses with a filler material.

12. A method as claimed in claim 11 wherein the filler material comprises the first material.

13. A method as claimed in claim 12 wherein the filler material comprises a doped first material.

14. A method as claimed in claim 1 wherein the discontinuous layer of the second material is formed directly on the first material.

15. A method as claimed in claim 1 wherein the discontinuous layer is selectively formed on the first material.

16. A method of forming a transistor comprising:
   providing a substrate formed from a first material, the substrate is prepared with a gate of a transistor and a channel region beneath the gate in a transistor region and isolation regions isolating the transistor region from other device regions;
   forming source/drain recesses in the substrate adjacent to the gate;
   forming a discontinuous layer comprising a second material in the source/drain recesses, the discontinuous layer is selectively formed on the first material of the recesses, the discontinuous layer comprises quantum dots and induces a strain in the channel region; and
   filling source/drain recesses with a filler material.

17. A method of forming a device comprising:
   providing a substrate comprising a first material, the substrate includes a device region prepared with a gate of a transistor and a channel beneath the gate; and
   forming a discontinuous layer of a second material only in source/drain regions adjacent to the gate, the discontinuous layer comprises quantum dots, the second material is different from the first material, wherein the discontinuous layer induces a first stress on the channel region.

18. The method of claim 17 wherein the discontinuous layer is selectively formed on the first material in the source/drain regions.

19. The method of claim 18 wherein forming the discontinuous layer comprises forming multiple discontinuous layers in the first region, wherein adjacent discontinuous layers are separated by a capping layer formed over a lower adjacent discontinuous layer.

20. The method of claim 17 further comprises forming recesses in the source/drain regions, the discontinuous layer is formed in the recesses.

21. The method of claim 20 wherein the discontinuous layer is selectively formed on the first material in the source/drain regions.

22. The method of claim 21 wherein forming the discontinuous layer comprises forming multiple discontinuous layers in the first region, wherein adjacent discontinuous layers are separated by a capping layer formed over a lower adjacent discontinuous layer.

23. The method of claim 20 wherein:
   isolation regions comprising a dielectric material isolate the device region from other device regions;
   first sidewall of the recesses adjacent to the gate and a bottom comprise the first material;
   second sidewall of the recesses opposing the first sidewall comprises the dielectric material; and
   the discontinuous layer is selectively formed on the first material in the source/drain regions.

24. The method of claim 23 wherein forming the discontinuous layer comprises:
   forming multiple discontinuous layers in the first region; and
   a capping layer separating adjacent discontinuous layers, wherein
      the capping layer covering a first discontinuous layer on the first sidewall and bottom of the recesses also lines the second sidewall of the recesses, and discontinuous layers over the first discontinuous layer form on the capping layer below.

25. The method of claim 20 wherein the recesses are filled with a filler material over the discontinuous layer.

26. The method of claim 25 wherein the first material comprises Si.

27. The method of claim 25 wherein the second material comprises an alloy having any combination of Si, Ge, In, As, P, C, and Sn, including SiGe, InAs, INP, SiC and SiSn.

28. The method of claim 17 wherein forming the discontinuous layer comprises forming multiple discontinuous layers in the first region, wherein adjacent discontinuous layers are separated by a capping layer formed over a lower adjacent discontinuous layer.

* * * * *